United States Patent
Ramachandra et al.

(10) Patent No.: US 9,053,066 B2
(45) Date of Patent: Jun. 9, 2015

(54) NAND FLASH MEMORY INTERFACE

(75) Inventors: Venkatesh Ramachandra, San Jose, CA (US); Farookh Moogat, Fremont, CA (US)

(73) Assignee: SanDisk Technologies Inc., Plano, TX (US)

(*) Notice: Subject to any disclaimer, the term of this patent is extended or adjusted under 35 U.S.C. 154(b) by 221 days.

(21) Appl. No.: 13/435,878

(22) Filed: Mar. 30, 2012

(65) Prior Publication Data

US 2013/0262744 A1    Oct. 3, 2013

(51) Int. Cl.
*G06F 12/00* (2006.01)
*G06F 13/16* (2006.01)
*G11C 7/10* (2006.01)
*G11C 5/06* (2006.01)

(52) U.S. Cl.
CPC .............. *G06F 13/1668* (2013.01); *G11C 7/10* (2013.01); *G11C 5/066* (2013.01); *G11C 7/1075* (2013.01); *Y02B 60/1228* (2013.01)

(58) Field of Classification Search
CPC ....... G11C 7/10; G06F 12/02; G06F 13/1668; G06F 1/04
USPC ........ 711/103, E12.008; 365/185.17, 185.33, 365/193, 233.13, 220, 221
See application file for complete search history.

(56) References Cited

U.S. PATENT DOCUMENTS

| | | | |
|---|---|---|---|
| 5,473,758 A * | 12/1995 | Allen et al. | 711/103 |
| 5,570,315 A | 10/1996 | Tanaka et al. | |
| 5,903,495 A | 5/1999 | Takeuchi et al. | |
| 5,966,723 A | 10/1999 | James et al. | |
| 6,046,935 A | 4/2000 | Takeuchi et al. | |
| 6,789,159 B1 * | 9/2004 | Carr et al. | 711/103 |
| 7,073,010 B2 | 7/2006 | Chen et al. | |
| 7,130,958 B2 | 10/2006 | Chou et al. | |
| 7,151,705 B2 * | 12/2006 | Polizzi et al. | 365/201 |
| 7,397,717 B2 * | 7/2008 | Chen et al. | 365/221 |
| 7,558,900 B2 | 7/2009 | Jigour et al. | |
| 8,102,710 B2 | 1/2012 | Pekny et al. | |
| 8,103,936 B2 | 1/2012 | Pekny et al. | |
| 2006/0034129 A1 * | 2/2006 | Matsubara et al. | 365/185.33 |
| 2006/0268642 A1 | 11/2006 | Chen et al. | |
| 2008/0052448 A1 * | 2/2008 | Minz et al. | 711/103 |
| 2009/0103362 A1 * | 4/2009 | Pekny et al. | 365/185.04 |

(Continued)

FOREIGN PATENT DOCUMENTS

EP    1424635 A1 *  6/2004
EP    2 011 122 A2    1/2009

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Matthew Bradley
*Assistant Examiner* — Francisco Grullon
(74) *Attorney, Agent, or Firm* — Davis Wright Tremaine LLP

(57) ABSTRACT

A NAND flash memory chip has a configurable interface that can communicate with a NAND flash memory controller using either parallel communication or serial communication. Serial communication requires fewer channels. Control information from the NAND flash memory controller uses a small number of channels. Double Data Rate (DDR) communication provides serial communication with adequate data transfer speed.

17 Claims, 14 Drawing Sheets

(56) References Cited

U.S. PATENT DOCUMENTS

| | | | | |
|---|---|---|---|---|
| 2009/0276561 | A1* | 11/2009 | Pekny et al. | 711/103 |
| 2010/0049948 | A1* | 2/2010 | Jigour et al. | 712/208 |
| 2011/0264851 | A1* | 10/2011 | Jeon et al. | 711/103 |

OTHER PUBLICATIONS

"Micron® Serial NAND Flash Memory", Micron Technology Inc. Jul. 28, 2009, 2 pages.

"1-Megabit 2.7-Volt Minimum DataFlash®"—AT45DB011D, Atmel, Apr. 2009, 52 pages.

"Open NAND Flash Interface Specification," ONFI Work Group, Revision 2.0, Mar. 9, 2011, pp. 1-282.

Notification of Transmittal of the International Search Report and the Written Opinion of the International Searching Authority, or the Declaration for International Application No. PCT/US2013/032458 mailed Oct. 9, 2013, 9 pages.

\* cited by examiner

| | CLE | REnx | DQS | DQ[3] |
|---|---|---|---|---|
| Command Cycle or Address cycle (Start bit within cmd/addr cycle will differentiate them) | 1 | 1 | Active Clk | Cmd or Addr data |
| Data in Cycle Memory has to also be in write mode via cmd | 0 | 1 | Active Clk | Active data In |
| Data out Cycle Memory has to also be in write mode via cmd | 0 | Active Clk In | Active CLK Out | Active data out |

|  |  | Prior Interfaces | | | Present Interface |
| --- | --- | --- | --- | --- | --- |
| Control Pins |  | Legacy | TM200 | TM400 | NSI |
|  | CLE | 1 | 1 | 1 | 1 |
|  | REn | 1 | 1 | 1 | 1 |
|  | DQS | 0 | 1 | 1 | 1 |
|  | CEn | 1 | 1 | 1 | 1 |
|  | ALE | 1 | 1 | 1 | 0 |
|  | WEn | 1 | 1 | 1 | 0 |
|  | WPn | 1 (optional) | 1 (optional) | 1 (optional) | 1 (optional) |
|  | RDY_BSYn | 1 (optional) | 1 (optional) | 1 (optional) | 1 (optional) |
|  | BDQS, BREn, Vref | 0 | 0 | 3 | 0 |
|  | SERIAL ENABLE | 0 | 0 | 0 | 1 |
| IO Pins |  |  |  |  |  |
|  | DQ[7:0] | 8 | 8 | 8 | 1 |
| Power Pins |  |  |  |  |  |
|  | VCC | 3 | 3 | 3 | 3 |
|  | VCCq | 2 | 3 | 4 | 1 |
|  | VSS | 4 | 5 | 6 | 3 |
| Control + IO + Power → Total Bonded → |  | 7+8+9 24 | 8+8+11 27 | 11+8+13 32 | 5(7)+1+7 13(15) |

*FIG. 16*

| # | Pins | Functionality of Pin |
| --- | --- | --- |
| 1 | CLE(Control) | Used to indicate command/address |
| 2 | DQS | Write strobe for cmd, address and data. Also used as strobe out for data out |
| 3 | REn | Used for as strobe to read data, same functionality as before |
| 4 | DQ[3] | Serial IO (IO close to DQS) |
| 5 | CEn | Needed for bus control and normal die select |
| 6 | RDY_BSYn | Same functionality as before and is optional |
| 7 | WPn | Same functionality as before and is optional |
| 8 | SERIAL ENB | New pin to enable serial mode. |
| 9 | VCC, VCCq, VSS | Supply |
| 11 | ALE | Not Used |
| 12 | WEn | Not Used |
| 13 | BDQS, BREn, Vref | Not Used |
| 14 | DQ[7:4], DQ[2:0] | Not Used |

*FIG. 17*

NAND FLASH MEMORY INTERFACE

BACKGROUND

This application relates to the operation of NAND flash memory systems, and, more specifically, to interfaces for communicating between NAND flash memory chips and NAND flash memory controllers in such systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

One type of flash memory that has become particularly popular for mass data storage applications is NAND flash memory. NAND flash memory is cost-effective for mass data storage, where data is not being frequently replaced or updated. For example, USB thumb drives, and Solid State Disks (SSDs) often use NAND flash memory for mass data storage. NAND flash memory chips are generally considered as commodity products that may meet some standardized specifications and communicate through standardized interfaces (e.g. "Legacy" Asynchronous mode and "Toggle Mode" interfaces). In addition to memory cells connected in a NAND configuration, a NAND flash memory chip generally includes peripheral circuits and controller interface circuits that manage communication with a NAND flash memory controller.

A NAND flash memory controller is typically provided within a NAND flash memory system to perform a variety of functions that may include logical-to-physical address translation, Error Correction. Coding (ECC), bad-block management, management of multiple NAND flash memory chips, communication with a host system, and other functions. The NAND flash memory controller is located between the NAND flash memory and the host so that the host accesses the NAND flash memory through the controller. A NAND flash memory controller is typically formed as a dedicated chip, an Application Specific Integrated Circuit (ASIC) that is designed to perform the particular functions needed in a particular memory system. Alternatively, some sort of general purpose memory controller may be loaded with firmware that is specific to a particular application. In either case, a NAND flash memory controller chip, separate from the NAND flash memory chip, or chips, is provided and connected between the NAND flash memory and the host.

NAND flash memory systems communicate with host systems over a variety of different interfaces such as USB, Compact Flash (CF), Secure Digital (SD), etc., which allow memory systems to be easily removed from one host and subsequently connected to another host that has an appropriate interface. In contrast, NAND flash memory controller chips and NAND flash memory chips are generally hard-wired to each other (bonded together within the same package, or on the same PCB) and are not configured to be removable. Typically, they are connected together using a simple parallel interface to allow high-speed data transfer. However, such simple parallel interfaces are not ideal for all NAND flash memory systems.

SUMMARY

According to a general aspect of the invention a NAND flash memory chip has a configurable interface for communication with a NAND flash memory controller chip. When the configurable-interface NAND flash memory chip is connected in a conventional arrangement, with a parallel data connection, the interface operates in parallel mode. When the configurable-interface NAND flash memory chip is connected in an alternative arrangement, with a serial data connection, the interface operates in serial mode, thus requiring fewer bonding wires and fewer bonding operations. In addition to reducing the number of data channels, the number of control channels may also be reduced by efficiently using a small number of control channels. Serial mode has the drawback that the data transfer rates at IO would be compromised if the interface operated at the same frequency as used in parallel mode. Using a high speed Double Data Rate data transfer the data transfer rates can be maintained at acceptable levels (e.g. 50 Megabytes per second with a 200 Megahertz clock frequency which matches the data rate of the current parallel "Legacy" Asynchronous Interface)

An example of a configurable-interface NAND flash memory chip includes: an array of NAND flash memory cells that contain stored data; an interface that includes a plurality of physical data Input/Outputs (I/Os); and an interface configuration circuit that selects a mode of operation for the interface from among at least: (a) a parallel interface mode in which the plurality of physical data I/Os operate in parallel to transfer stored data, and (b) a serial interface mode in which one of the plurality of physical data I/Os operates serially to transfer stored data.

A configurable-interface NAND flash memory chip may also include a control I/O that, in both the parallel interface mode and the serial interface mode, transfers commands from a memory controller chip to the configurable-interface NAND flash memory chip, and does not transfer stored data. At least one of the plurality of interface I/Os that operate in parallel in the parallel interface mode may be idle in the serial interface mode. In the serial interface mode the serially-operating I/O may use Double Data Rate (DDR) communication to transfer two bits per clock cycle. The DDR communication may use a clock signal with a frequency of at least 200 Megahertz to obtain a data transfer rate of at least 50 Megabytes per second. With the serial interface mode timing can be improved so that in some cases the clock frequency may be higher than 200 MHz. In the serial interface mode, the I/O that operates serially may use a signal voltage of 1.8 volts or less.

An example of a method of configuring a NAND flash memory chip includes: receiving, by the NAND flash memory chip, a signal from a NAND flash memory controller; determining, by the NAND flash memory chip, from the signal, whether the NAND flash memory controller is initiating parallel communication or serial communication; and in response to determining that the NAND flash memory controller chip is initiating serial communication, the NAND flash memory chip entering a serial communication mode in which stored data is transferred serially.

The method of configuring the NAND flash memory chip may further include, in response to determining that the controller is initiating parallel communication, the NAND flash memory chip entering a parallel communication mode in which stored data is transferred in parallel. The NAND flash memory chip may use a first number of I/Os in the parallel communication mode and uses a second number of I/Os in the serial communication mode, the second number being smaller than the first number. The first number of I/Os may contain both data I/Os and control I/Os, and the second number of I/Os may contain fewer data I/Os and fewer control I/Os than the first number. In the serial communication mode, data may be transferred serially at at least Double Data Rate (DDR) so that at least two bits of data are transferred per clock cycle. The data may be transferred serially using a clock frequency of at least 200 Megahertz to provide a data transfer rate of at least 50 Megabytes per second.

An example of a NAND flash memory interface between a NAND flash memory chip and a NAND flash memory controller includes: (a) a serial Double Data Rate (DDR) data channel that transfers host data between the NAND flash memory chip and the NAND flash memory controller; and (b) a plurality of control channels that transfer control signals from the NAND flash memory controller to the NAND flash memory chip in parallel with transfer of data on the serial DDR data channel.

The plurality of control channels may include: (c) a Read Enable (REn) channel; and (d) a strobe channel. The strobe channel may operate with a clock frequency of at least 200 Megahertz to transfer data at at least 50 Megabytes per second. The serial DDR data channel operates with a signal voltage of 1.8 volts.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of ten is between any of the incorporated publications, documents or things and the present application, those of the present application shall prevail.

BRIEF DESCRIPTION OF THE DRAWINGS

FIG. 16 shows comparison between certain prior interfaces and an interface of an embodiment of the present invention.

FIG. 17 shows functionality of pins of an interface according to an embodiment of the present invention.

DETAILED DESCRIPTION

Memory System

Figure 1A:
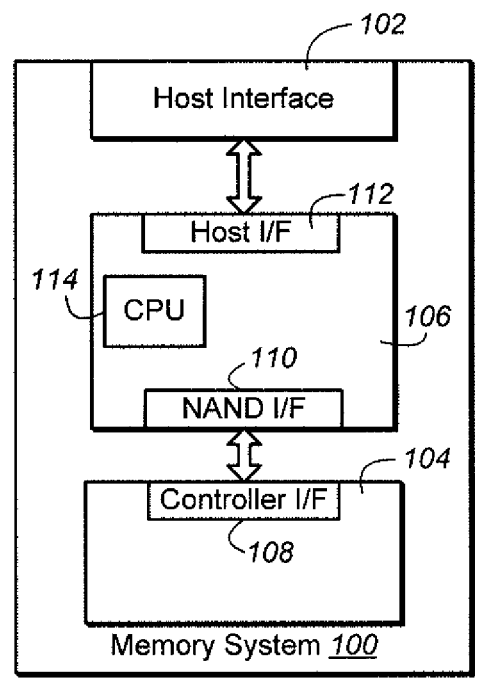
FIG. 1A illustrates the main hardware components of a memory system suitable for implementing aspects of the present invention.

FIG. 1A illustrates schematically the main hardware components of a NAND flash memory system 100 suitable for implementing the present invention. The NAND flash memory system 100 typically operates with a host through the host interface 102 which may follow a predefined standard that allows the NAND flash memory system to interface with a variety of host systems. The NAND flash memory system is typically in the form of a memory card, SSD, or an embedded memory system. The memory system 100 includes a NAND flash memory 104 whose operations are controlled by a NAND flash memory controller 106. The NAND flash memory 104 comprises one or more arrays of non-volatile memory cells distributed over one or more integrated circuit chips, with a controller interface 108 for communication with the NAND flash memory controller 106. The NAND flash memory controller 106 includes a NAND flash memory interface 110, a host interface 112, a Central Processing Unit (CPU) 114, and may include several other components such as Read Only Memory (ROM), and Random Access Memory (RAM).

Figure 1B:
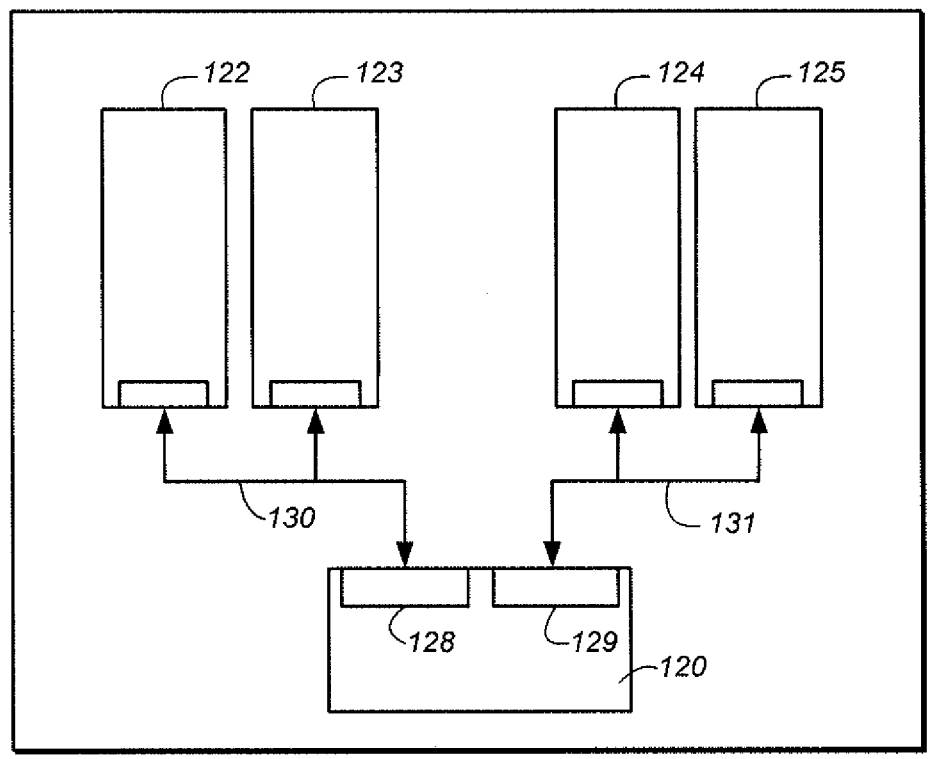
FIG. 1B illustrates another memory system with multiple memory chips, suitable for implementing aspects of the present invention.

FIG. 1B shows another common arrangement in which a single NAND flash memory controller chip 120 communicates with multiple NAND flash memory dies 122-125. Four NAND flash memory dies are shown in this example for simplicity, though many more may be present in some examples. Each die may be on a separate NAND flash memory chip, or two or more dies may be located on the same chip. The NAND flash memory controller chip 120 is shown having two separate NAND flash memory interfaces 128-129, each connected to a separate bus 130-131. Each bus in turn serves two NAND flash memory dies. Such an arrangement, where a controller operates two separate interfaces for two separate busses, may be considered a two-channel arrangement. In some cases, a NAND flash memory controller may operate four, eight, or more channels, and each channel may include a bus that serves four, eight or more NAND flash memory dies.

Figure 2:
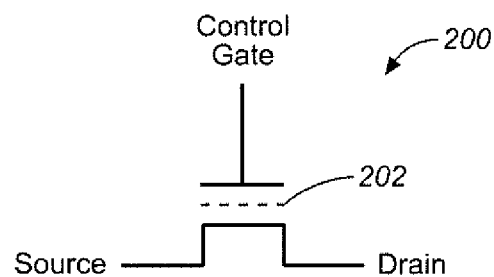
FIG. 2 illustrates a flash memory cell.

FIG. 2 illustrates schematically a non-volatile memory cell 200. The memory cell can be implemented by a field-effect transistor having a charge storage unit 202, such as a floating gate or a dielectric layer. The memory cell 200 also includes a source, a drain, and a control gate.

Examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron. Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
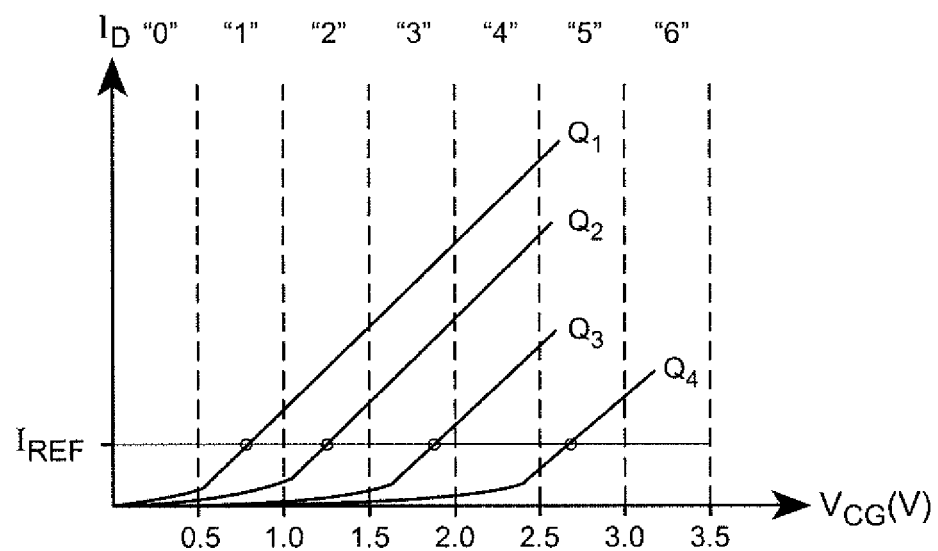
FIG. 3 illustrates how a flash memory cell may be read.

FIG. 3 illustrates the relationship between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

Figure 4A:
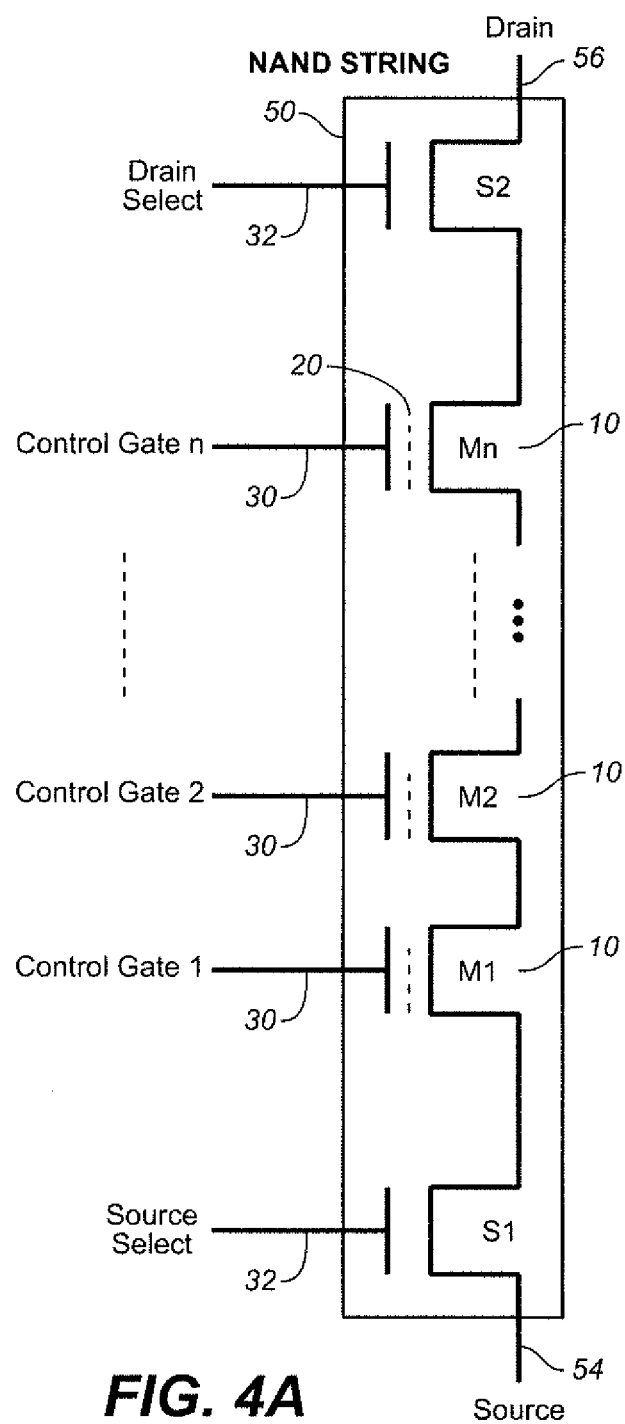
FIG. 4A illustrates how multiple flash memory cells may be connected in series to form a NAND flash memory string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
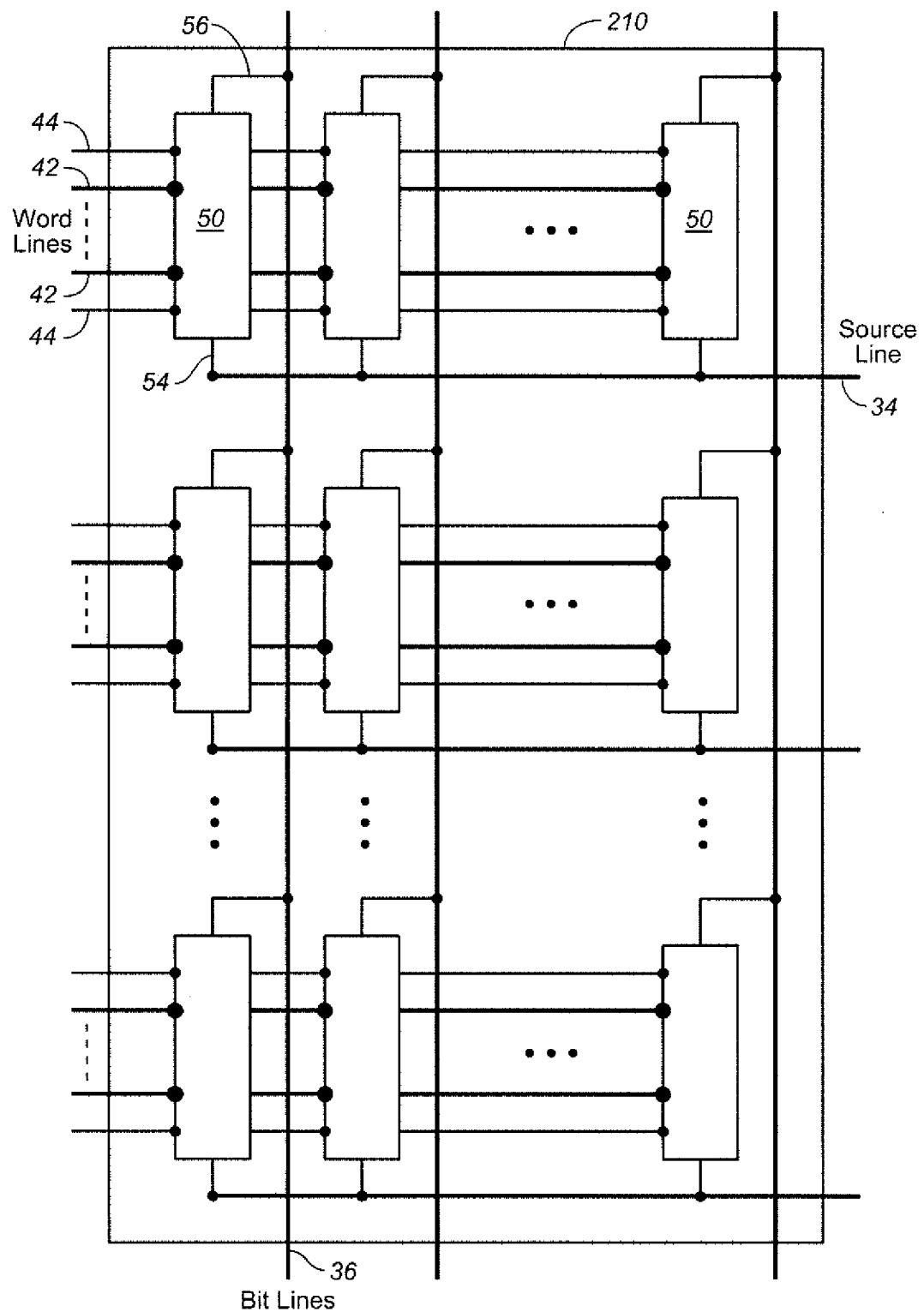
FIG. 4B illustrates how NAND flash memory strings may be connected in an array in a NAND flash memory chip.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
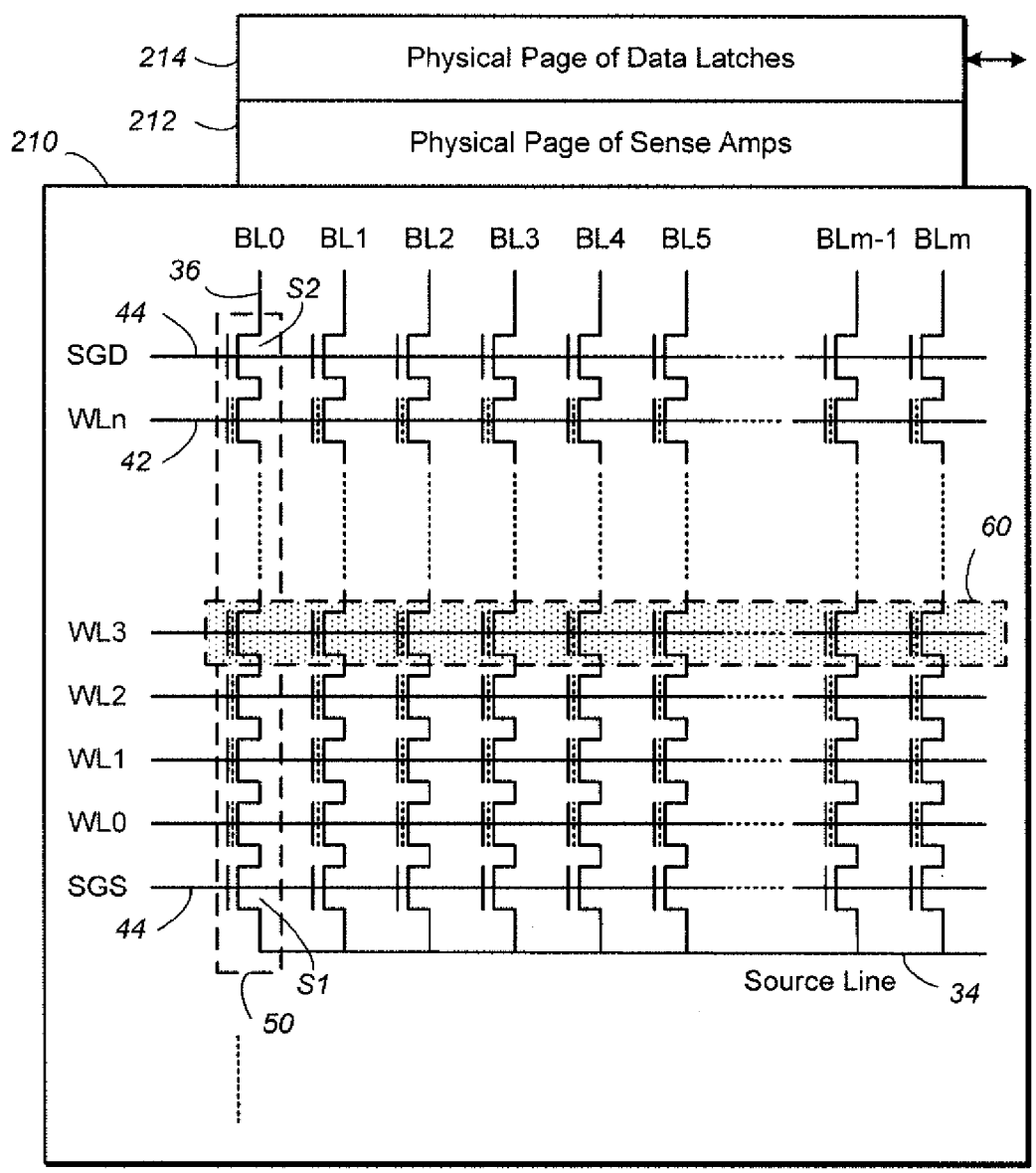
FIG. 5 illustrates how cells of different NAND stings in a NAND flash memory array are read in parallel as a page.

FIG. 5 illustrates a page of memory cells, organized in the NAND configuration, being sensed or programmed in parallel. FIG. 5 shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

While a page, such as page 60, in a NAND flash memory may contain many bits that are read in parallel, an entire page is generally not transferred from the NAND flash memory chip to the NAND flash memory controller in parallel. In a typical arrangement, data is sent from the NAND flash memory chip to the NAND flash memory controller over a parallel interface that has capacity to send a portion of a page at a time. The NAND flash memory chip thus typically includes circuits to hold a page of data that may include thousands of bits, and to transfer the data in smaller portions to the memory controller. A typical interface uses eight data channels so that eight bits (one byte) can be sent at a time.

Figure 6:
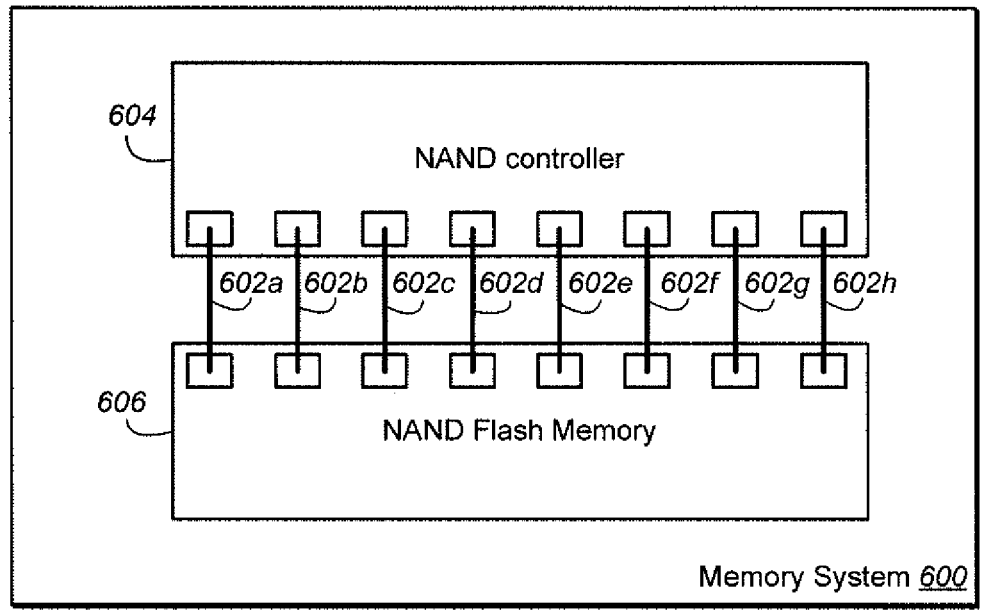
FIG. 6 illustrates the physical connections of the 10 pins for data between a NAND flash memory controller and a NAND flash memory chip in parallel mode.

FIG. 6 shows a memory system 600 with eight data channels 602a-h between a NAND flash memory controller chip 604 and NAND flash memory chip 606. Each data channel includes a bonding pad on the NAND flash memory controller chip 604, a bonding wire, and a bonding pad on the NAND flash memory chip 606. Typically, bonding wire is attached to the bonding pads on either chip by ball bonding. In one arrangement, both chips are packaged together so that the bonding wire can extend from one chip to the other. In another arrangement, each chip is packaged separately, with bonding pads connected to package pins through the bonding wire. The packages are mounted on a Printed Circuit Board (PCB) and pins of respective packages are connected by traces on the PCB. Thus, data channels may include multiple bonding wire segments, pins, and traces. Channels may also contain additional components in some cases. A bonding pad may be considered as a physical Input/Output ("I/O") of a NAND flash memory chip or NAND flash memory controller chip. The present invention is not limited to any particular packaging technique and may apply to chips that are stacked in a package, or mounted to a PCB using flip-chip or other technique.

Figure 7:
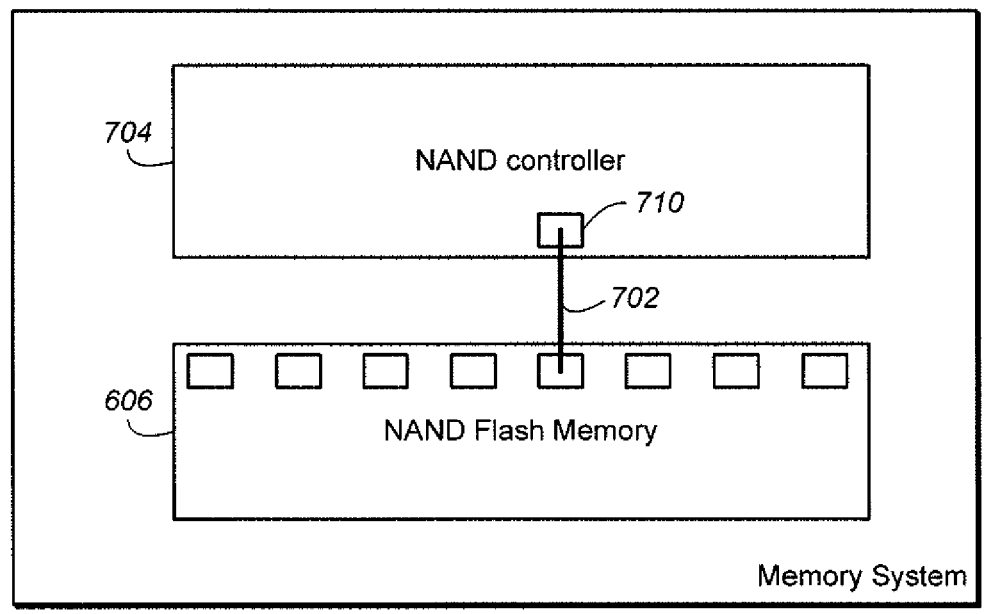
FIG. 7 illustrates the physical connections of the 10 pins for data between a NAND flash memory controller and a NAND flash memory chip in serial mode.

According to an aspect of the present invention, a NAND flash memory chip 606 has a configurable interface so that it can be configured in a parallel configuration, as shown in FIG. 6, with multiple data channels 602a-h connected in parallel for parallel transfer of data between the NAND flash memory chip 606 and the NAND flash memory controller chip 604. In addition, the NAND flash memory chip 606 may be configured so that it can communicate with a NAND flash memory controller 704 serially, using a single data I/O 702, as shown in FIG. 7. While such an arrangement may have a slower data transfer speed than the arrangement of FIG. 6, there may be a significant saving in cost and complexity of connecting the NAND flash memory chip 606 and NAND flash memory controller 704, which makes it an attractive alternative in applications where data transfer speed is not critical.

It will be understood that because the NAND flash memory chip 606 is configurable to operate in both parallel mode and serial mode, it has sufficient data I/Os for parallel data transfer (for example, eight I/Os). This allows it to be compatible with legacy systems which use a parallel interface. A NAND flash memory controller on the other hand is generally an ASIC designed for a particular application so that only the I/Os needed for that application are provided, thus saving cost and complexity. Thus FIG. 7 shows a NAND flash memory controller chip 704 that has only one data I/O 710 because, in this application, this is all that is required.

Figures 8, 9:
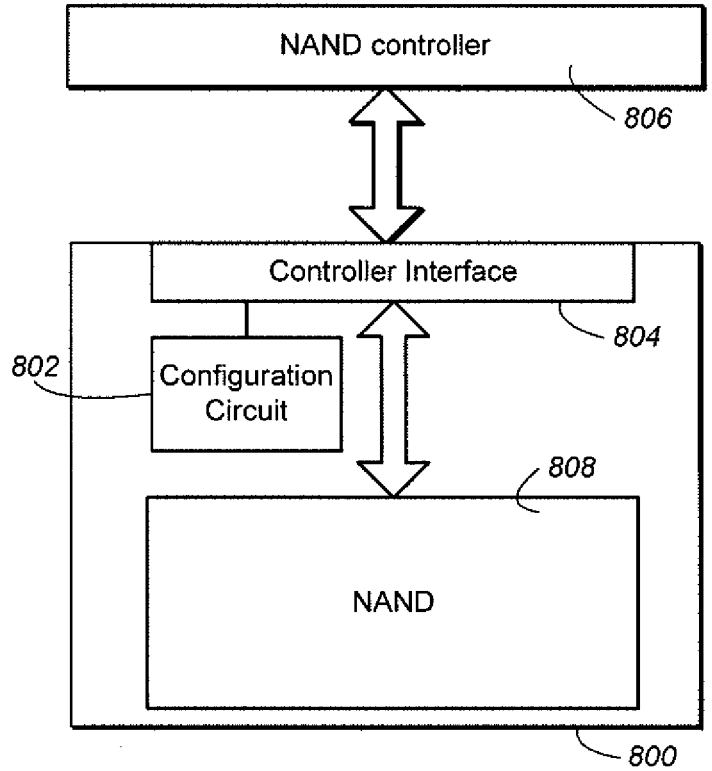
FIG. 8 illustrates certain circuits of a configurable-interface NAND flash memory chip.
FIG. 9 illustrates how certain I/Os of a NAND flash memory interface may be used.

FIG. 8 shows an example of a configurable-interface NAND flash memory chip 800. A configuration circuit 802 is provided in the NAND flash memory chip 800, in addition to the controller interface 804. The configuration circuit 802 is responsible for determining how the controller interface 804 is to be configured, in parallel mode or in serial mode, and carrying out the configuration. In general, configuration of the interface in either parallel or serial mode is a one-time procedure because the configuration reflects the hard-wired (permanent) physical connections to the NAND flash memory chip. The configuration circuit 802 may determine which configuration to implement from a signal received from the NAND controller 806, from some testing of physical connections of the controller interface 804, from some configuration information stored in the NAND flash memory chip 808 (e.g. in fuses or ROM), or in some other suitable manner.

While FIG. 6-7 show only the data channels between NAND flash memory chip and NAND flash memory controller chip in the two different configurations, embodiments of the present invention also relate to other I/Os in a NAND flash memory interface. In addition to the reduction in the number of data channels, it has been found that the number of control channels and power supplies can also be reduced. While the number of I/Os provided in the NAND flash memory chip may remain the same as in a legacy system in order to allow compatibility with a legacy interface, the number of I/Os that are actually connected may be lowered significantly (with, for example, seven data I/Os unconnected, and several other I/Os also unconnected) so that significant benefits can be obtained.

FIG. 9 summarizes an example of how four I/Os can be used for efficient communication between a NAND flash memory controller chip and a NAND flash memory chip. The four I/Os include two control I/Os, CLE (Command Latch Enable), and REnx (Read Enable), in addition to data strobe, DQS, and serial data I/O, DQ (IOx). A Chip Enable (CEn), which is not shown in FIG. 9, may also be used to select a particular chip in a multi-chip arrangement. A command or address cycle may be indicated by the NAND flash memory controller setting CLE and REnx to 1, with the first 2 bits within the command or address cycle signifying whether it is a command or an address cycle. A Data In Cycle may be indicated by placing the NAND flash memory chip in write mode using a command (i.e. the NAND flash memory controller initiates a command cycle and then sends a command telling the NAND flash memory chip to enter write mode), then setting CLE to 0, and REnx to 1. A Data Out Cycle may be indicated by placing the NAND flash memory chip in read mode using a command (i.e. the NAND flash memory controller initiates a command cycle and then sends a command telling the NAND flash memory chip to enter read mode), then setting CLE to 0, and sending a clock signal on REnx, which becomes the Active Clock In (DQS is used as an Active Strobe Clock Out in this case). The use of these I/Os may be further understood from the timing diagrams of FIGS. 10-13.

Figure 10:
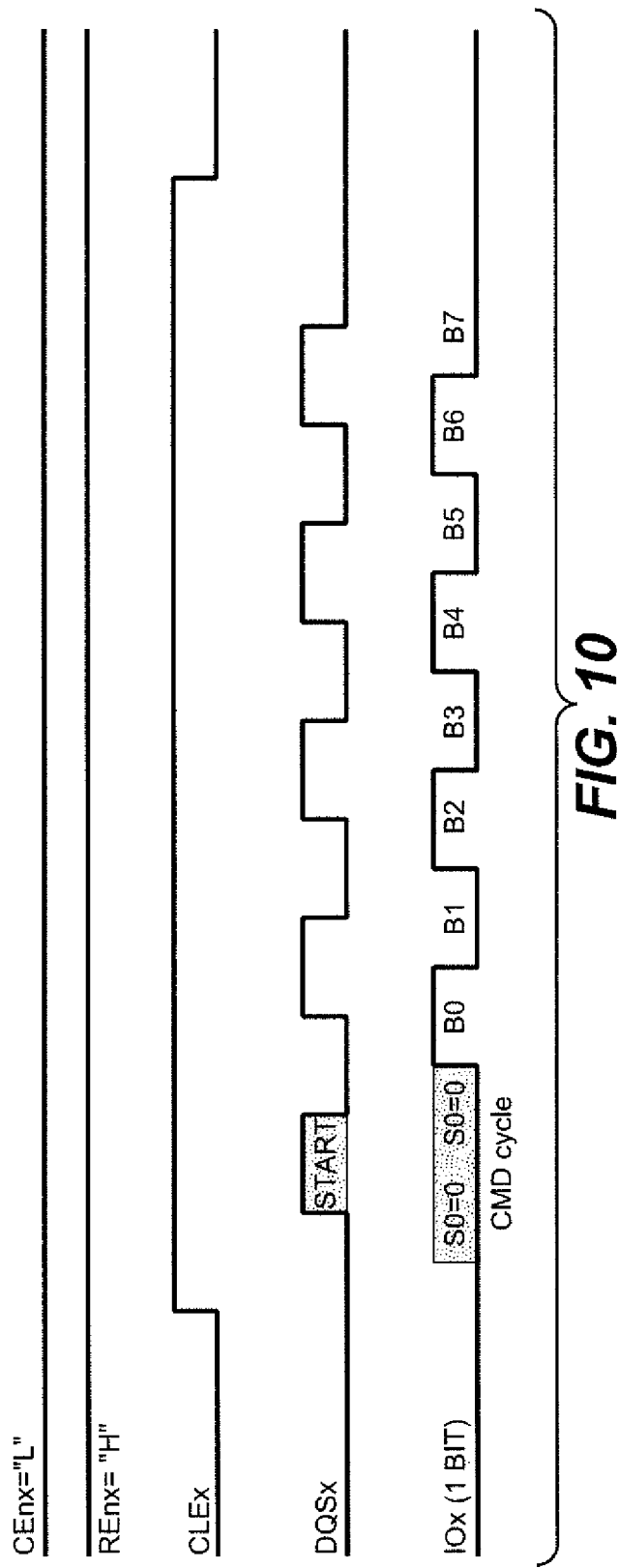
FIG. 10 is a timing diagram for a NAND flash memory interface command cycle.

FIG. 10 is a timing diagram illustrating an example of how a NAND flash memory controller may indicate a command cycle to a NAND flash memory chip through an exemplary interface. CEnx (Chip Enable for the NAND flash memory chip) is low so that the chip is selected. REnx and CLEx are both high (both "1"). The NAND flash memory controller sends an active clock signal on DQSx. The first two bits sent over IOx (DQ), in this case the first rising and falling edges of DQSx, indicate that the subsequent bits on IOx form a command. This is indicated by a "0" bit in this example. The command in this example is an eight-bit long command and may be a read command, or a write command, or some other command. When the command has been sent, the clock signal on DQSx stops and CLEx returns to low.

Figure 11:
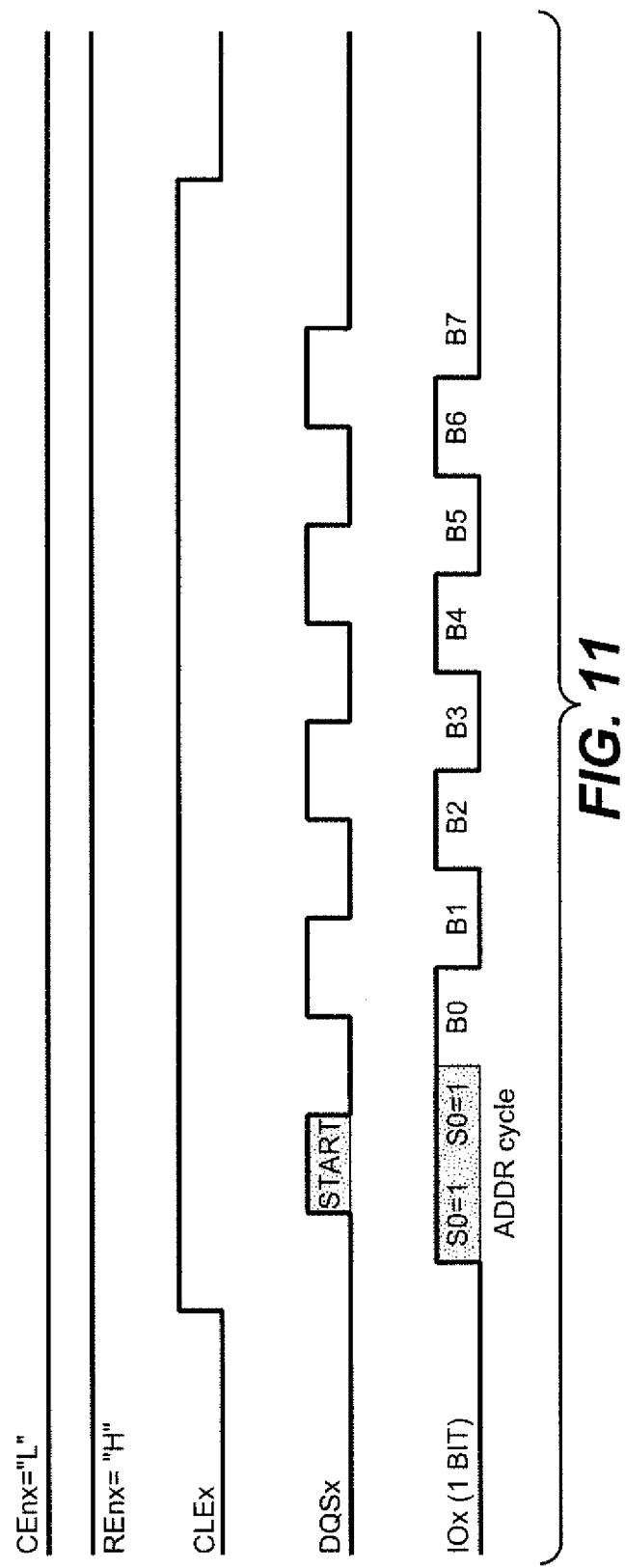
FIG. 11 is a timing diagram for a NAND flash memory interface address cycle.

FIG. 11 is a timing diagram illustrating an example of how a NAND flash memory controller may indicate an address cycle to a NAND flash memory chip through an exemplary interface. CEnx (Chip Enable for the NAND flash memory chip) is low so that the chip is selected. REnx and CLEx are both high. The NAND flash memory controller sends an active clock signal on DSQx. The first two bits sent over IOx (DQ), in this case the first rising and falling edges of DQSx indicate that the subsequent bits on IOx form an address. This is indicated by a "1" bit in this example. The address is an eight-bit long address in this example and may be an address from which data is to be read, or an address at which data is to be written, or some other address. When the address has been sent, the clock signal on DQSx stops and CLEx returns to low.

Figure 12:
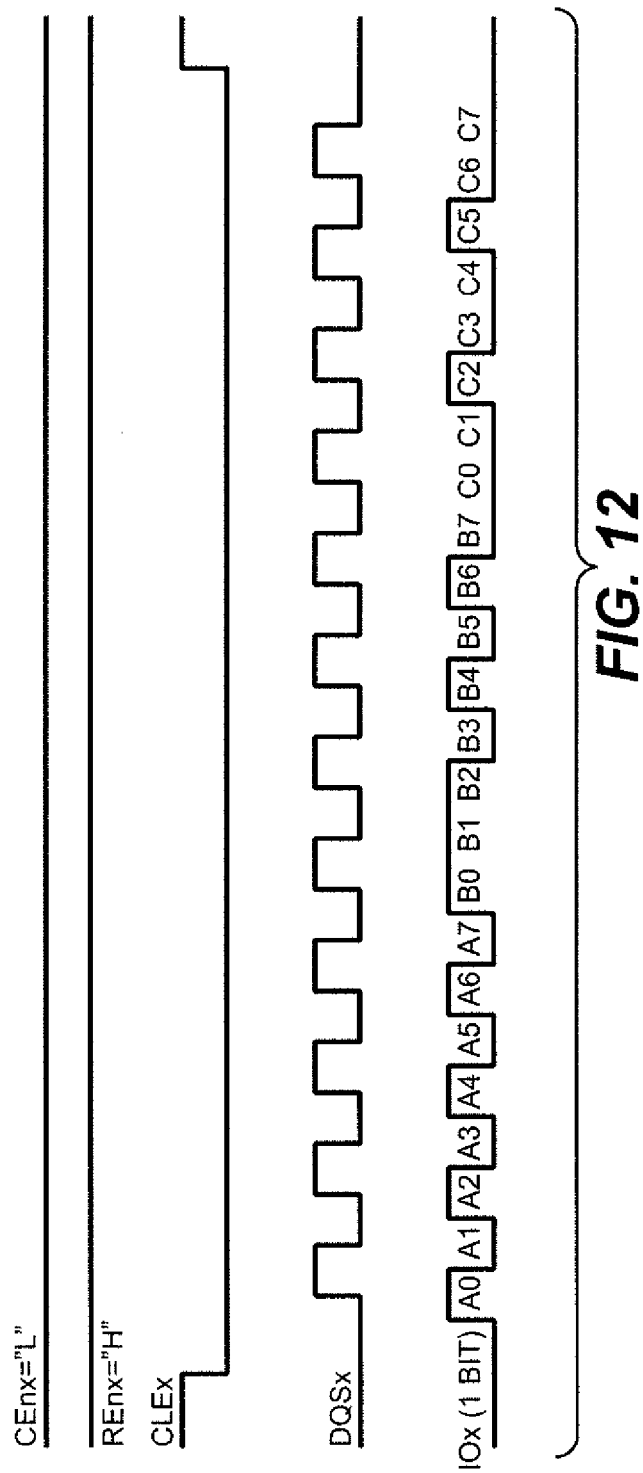
FIG. 12 is a timing diagram for a NAND flash memory interface data write.

FIG. 12 is a timing diagram illustrating an example of how a NAND flash memory controller may send data to a NAND flash memory chip (Data In Cycle) through an exemplary interface. Initially, the NAND flash memory chip is placed in write mode through a command sent by the NAND flash memory controller (not shown in timing diagram). CEnx is low so that the chip is selected. REnx is high and CLEx is low. An active clock signal is sent from the NAND flash memory controller on DQSx. The data to be written to memory cells in the NAND flash memory is sent by the NAND flash memory controller, to the NAND flash memory chip, serially, on IOx (DQ). FIG. 12 shows two bits of data being transferred for each cycle of the active clock signal (DQSx), on rising and falling edges of the clock signal. Such Double Data Rate (DDR) transfer can double the data transfer speed as compared with Single Data Rate (SDR) communication in which only one bit is sent per clock cycle, and thus helps to offset the impact of going from eight data I/Os to one. Alternatively, a serial interface may use DDR2, DDR3, or DDR4 communication. Using a clock speed of, for example, 200 Megahertz, with DDR, can provide a data transfer speed of 50 Megabytes per second. Higher data transfer speeds may be achieved using higher clock speeds. Signal voltages used in the Data In cycle of FIG. 12 and other operations described here may be, for example, 1.8 volts, or lower.

Figure 13:
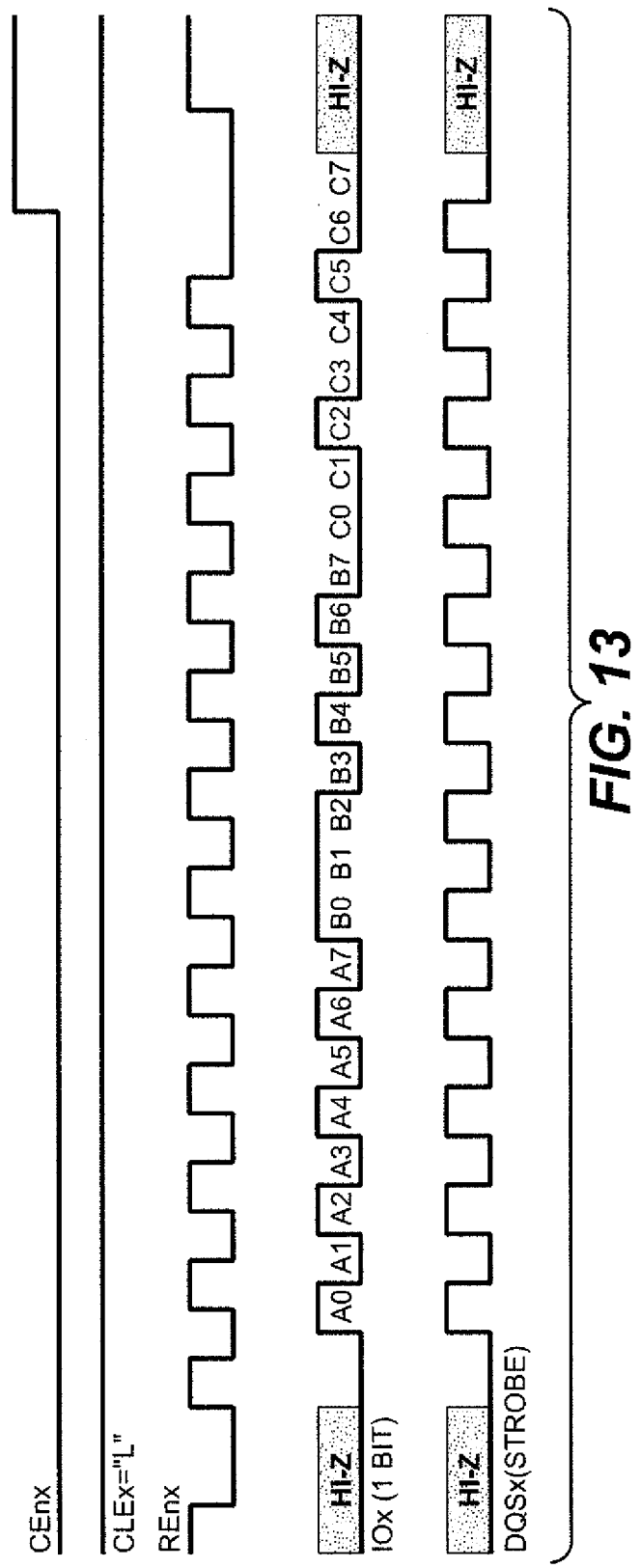
FIG. 13 is a timing diagram for a NAND flash memory interface data read.

FIG. 13 is a timing diagram illustrating an example of how a NAND flash memory controller may obtain data from a NAND flash memory chip (Data Out Cycle) through an exemplary interface. Initially, the NAND flash memory chip is placed in read mode through a command sent by the NAND flash memory controller (not shown in timing diagram). CEnx is low so that the chip is selected. CLEC: is low and the NAND flash memory controller sends an active clock signal (Active Clock In) on REnx. The requested data is sent by the NAND flash memory chip to the NAND flash memory controller on a single IOx (DQ). The NAND flash memory chip also sends an active clock strobe signal (Active Clock Out) on DQSx.

While serial data transfer using a single channel is described above, the interface may not be considered as a conventional serial interface because control signals are sent over separate dedicated channels. This is in contrast to conventional serial interfaces, which embed control information in headers, or in some other form, and send the control information over the same channels as the data. An interface with serial data communication over one channel and separate control communication over separate channels may be considered a hybrid interface that is includes both serial and parallel aspects. While the terms "serial mode" and "serial interface" are used to refer to the operation of the interface, it will be understood that this means that data is sent serially, but does not mean that control data is also sent serially through the same channel, or that the interface is a serial interface in the conventional sense. By keeping the data channel for data rather than control signals, the data transfer speed can be higher than if control signals were also sent through the same channel. Keeping control signals on dedicated control channels may also facilitate backward compatibility.

In addition to the communications above, a NAND flash memory controller may indicate to a NAND flash memory chip that a serial interface, rather than a parallel interface, is to be used for communication. This is typically done just once when the memory system is initialized. The NAND flash memory chip may determine that it is to operate its controller interface in serial mode from a specific command from the NAND flash memory controller, or otherwise.

Figure 14:
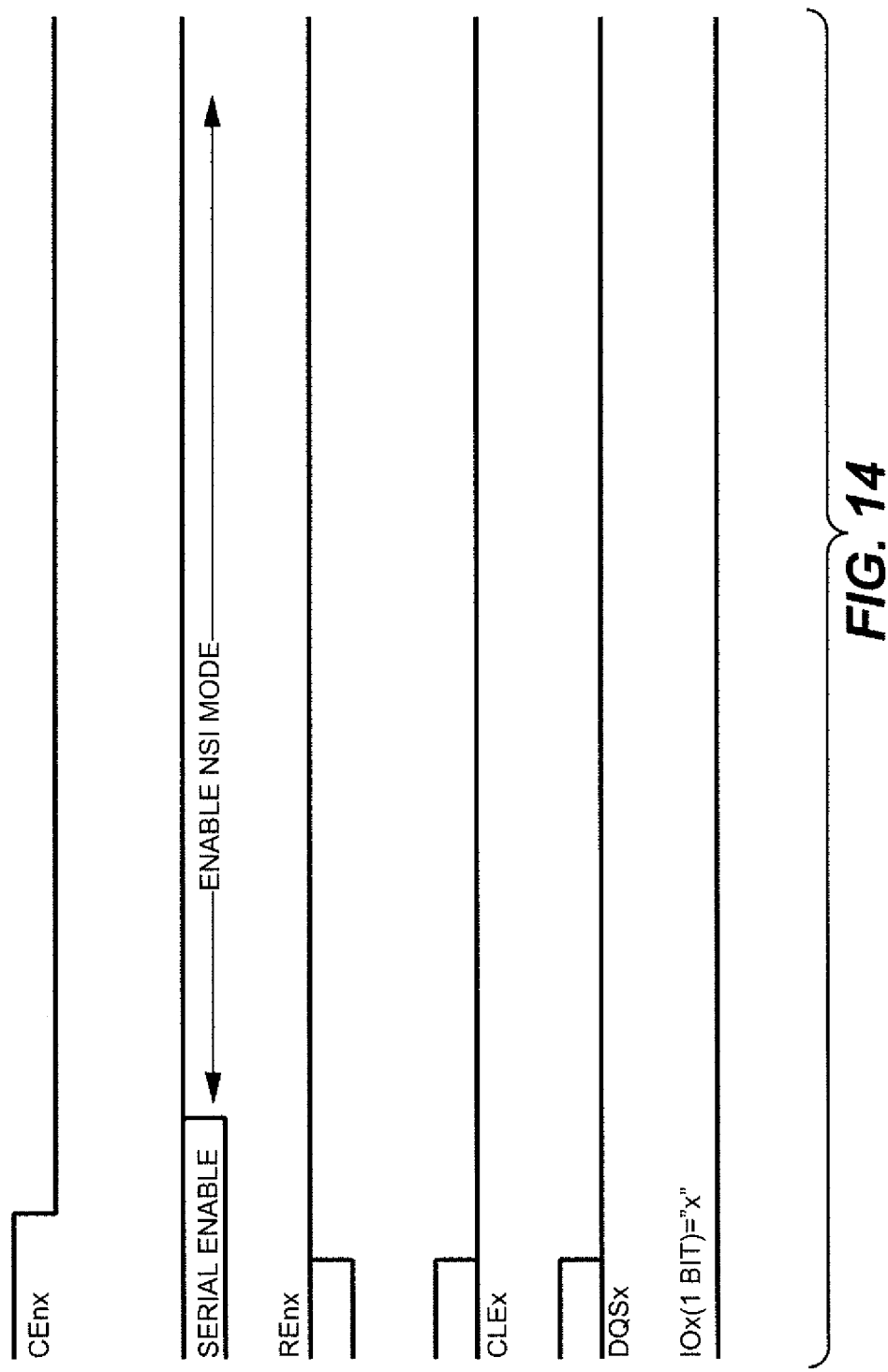
FIG. 14 is a timing diagram for a NAND flash memory chip entering serial mode.

FIG. 14 is a timing diagram illustrating an example of how a configurable-interface NAND flash memory chip may determine that it is to operate in serial mode. CEnx is low so that the chip is selected. When the NAND flash memory chip is powered on for the first time, the NAND flash memory chip goes into a configuration mode. A dedicated pin "Serial Enable" is provided to indicate to the NAND flash memory chip that it is to operate in serial mode. In some cases this is simply bonded to Vcc. In other cases it may be driven by the flash memory controller chip.

Figure 15:
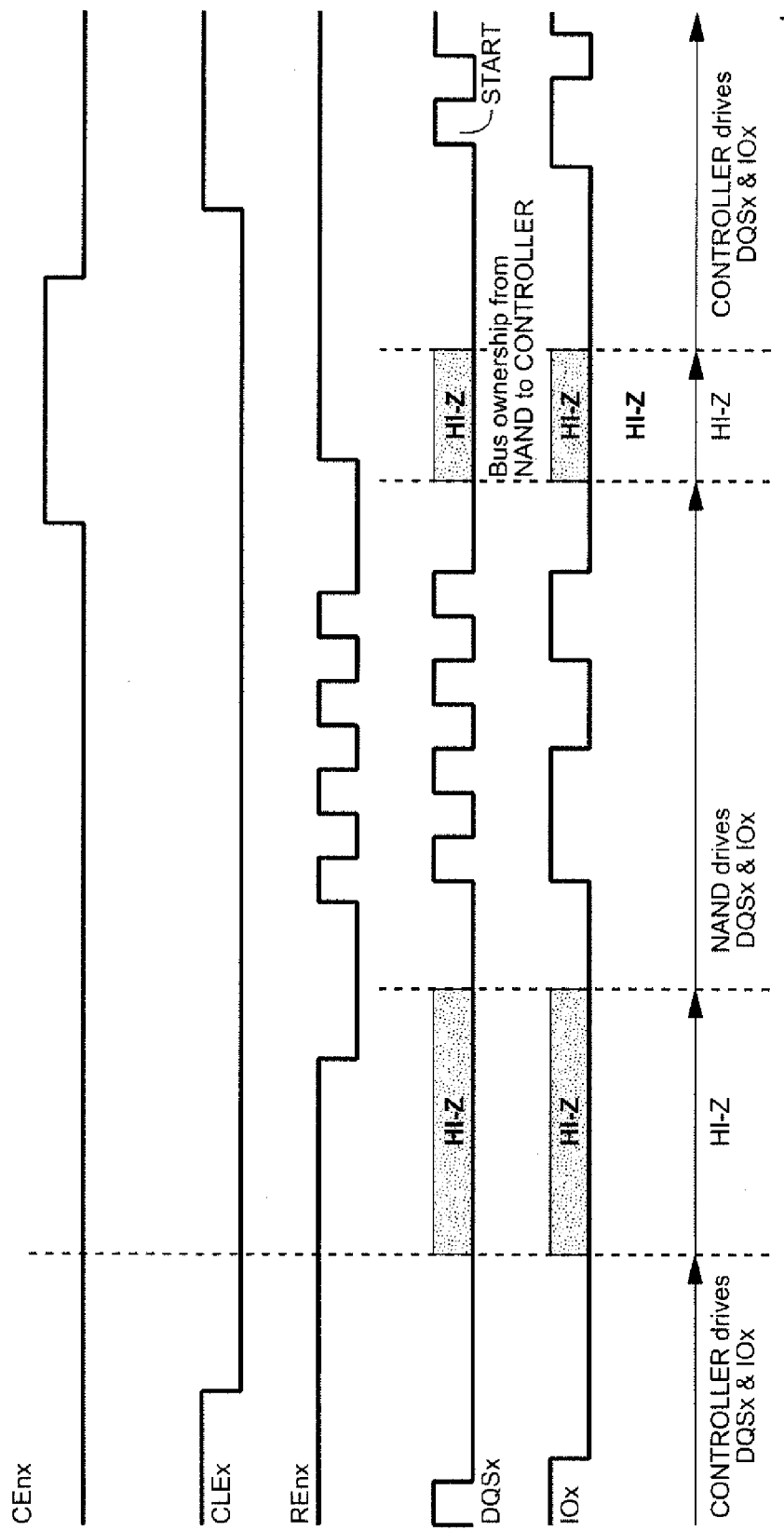
FIG. 15 is a timing diagram for a NAND flash memory interface showing bus ownership transfer between NAND flash memory controller and NAND flash memory chip.

FIG. 15 is a timing diagram indicating how ownership of the bus between a NAND flash memory controller and a NAND flash memory chip may be switched from the controller to the flash memory, and from the flash memory to the controller. Initially, the controller has ownership of the bus and drives DQSx and IOx. After the Read mode is initiated by the controller it can give up the ownership of the DQS and IOx signals. Then, when read mode is enabled using REnx=L, with DQSx and IOx in a high impedance ("HI-Z") state, the NAND flash memory chip takes control of DQSx and IOx. Subsequently, when the read operation is completed, read mode is disabled using CEnx and bus ownership goes to the memory controller which then drives DQSx and IOx. REnx can be pulled back to high state after CEnx is pulled high.

FIG. 16 provides a comparison between the I/Os used by certain prior NAND flash memory interfaces and the I/Os used by the present interface. It can be seen that these prior NAND flash memory interfaces have used 24-32 I/Os for communication between the NAND flash memory controller and the NAND flash memory chip. In contrast, an interface according to an embodiment of the present invention may use just 13 I/Os. The reduced number is the result of eliminating seven of eight data I/Os, eliminating certain control I/Os that are made unnecessary by more efficient use of control I/Os. Because there is only one data I/O (only one data I/O toggling along with the clock), less power is required than if there were eight data I/Os, so the number of power I/Os can also be reduced (from as many as six to three in this example).

FIG. 17 provides a description of the functionality of the pins in the present interface in comparison with an example of a prior interface, the TM400 interface. It can be seen that fewer pins are needed because the pins are more efficiently used. Thus, a configurable-interface NAND flash memory chip that is configurable for either TM400 parallel mode, or serial mode, requires fewer bonding wires etc. when connected in serial mode. It should be noted that the Reference Voltage pin "Vref" is described as "not used" because Vref may be internally generated. Also the differential clocks may not be needed with the serial interface as the timing will be better due to the use of a single IO.

An interface as described in one or more of the above examples may have several advantages over prior NAND flash interfaces. The number of channels between a NAND flash controller and a NAND flash memory chip may be reduced considerably. While the number of pads on a NAND flash memory chip may remain the same so that the NAND flash memory chip can be configured for parallel communication, several of these pads are not bonded when the NAND flash memory is configured for serial communication. This saves the cost of bonding wire, the time and expense of bonding operation, and the bonding failure rate which increases with the number of bonding operations performed.

Additional savings may be realized on a NAND flash memory controller when using an interface according to examples above. Because a NAND flash memory controller is typically an ASIC, a controller for an application using such an interface may have a reduced number of I/Os. This means that there are fewer bonding pads which saves space allowing the ASIC to be smaller and therefore cheaper. The reduction in the number of bonding pads is particularly important for multi-channel applications such as shown in FIG. 1B. In such applications, the number of channels may be limited by the area available for bonding pads. By reducing the number of I/Os per channel, a NAND flash memory controller can operate more channels.

Additional advantages include a reduction in On Die Termination (ODT) current. By reducing the number of data I/Os, the ODT current is reduced and problems associated with ODT are reduced. In particular, in mobile devices, where power is a major concern, the power that would be consumed by eight data channels using ODT has generally made the use of ODT unattractive. However, with one serial channel, the power consumed by ODT becomes acceptable, and the advantages of ODT (e.g. reduced noise) may outweigh any disadvantage (e.g. power consumption). Parallel interfaces present particular problems at higher speeds that are not present in serial interfaces (e.g. noise, crosstalk, skew). Thus, higher speeds are generally achievable using serial interfaces. Testing time and cost may be reduced because the number of bonding pads to be tested is reduced. This may apply to both the NAND flash memory controller, which has fewer bonding pads than before, and to the NAND flash memory chip, which has the same number of bonding pads as before but which, in some applications, may not need certain bonding pads, thus making testing of those pads unnecessary. Simultaneous Switching Output (SSO) noise may be dramatically reduced by reducing the number of I/Os.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A configurable-interface NAND flash memory chip comprising:
   an array of NAND flash memory cells that contain stored data, the array of NAND flash memory cells formed on the NAND flash memory chip;
   an interface that includes a plurality of physical data Input/Outputs (I/Os), the interface formed on the NAND flash memory chip; and
   an interface configuration circuit formed on the NAND flash memory chip that selects a mode of operation for the interface in a one-time procedure that reflects permanent hard-wired connections to the plurality of physical I/Os from among at least:
   (a) a parallel interface mode in which the plurality of physical data I/Os each have permanent hard-wired connections and operate in parallel to transfer stored data, and
   (b) a serial interface mode in which one of the plurality of physical data I/Os has a permanent hard-wired connection and operates serially to transfer stored data, while other physical data I/Os of the plurality of physical data I/Os are idle and are physically unconnected.

2. The configurable-interface NAND flash memory chip of claim 1 further comprising a control I/O that, in both the parallel interface mode and the serial interface mode, transfers commands from a memory controller chip to the configurable-interface NAND flash memory chip, and does not transfer stored data.

3. The configurable-interface NAND flash memory chip of claim 1 wherein the configuration circuit selects the mode of operation from testing of physical data I/Os of the interface.

4. The configurable-interface NAND flash memory chip of claim 3 wherein the plurality of physical data I/Os comprises eight data I/Os that in the parallel interface mode operate to transfer at least eight bits in parallel, and wherein seven of the eight physical data I/Os are idle, physically unconnected, and do not transfer any data in the serial interface mode.

5. The configurable-interface NAND flash memory chip of claim 4 wherein each physical data I/O is a separate bonding pad on the NAND flash memory chip, and wherein in parallel interface mode each of the separate bonding pads is physically connected to a corresponding bonding pad on a NAND flash memory controller chip.

6. The configurable-interface NAND flash memory chip of claim 5 wherein in serial interface mode, the seven idle bonding pads on the NAND flash memory chip are not bonded.

7. The configurable-interface NAND flash memory chip of claim 1 wherein, in the serial interface mode the serially-operating I/O uses Double Data Rate (DDR) communication to transfer two bits per clock cycle.

8. The configurable-interface NAND flash memory of claim 7 wherein the DDR communication uses a clock signal with a frequency of at least 200 Megahertz to obtain a data transfer rate of at least 50 Megabytes per second.

9. The configurable-interface NAND flash memory of claim 1 wherein, in the serial interface mode, the I/O that operates serially uses a signal voltage of 1.8 volts.

10. The configurable-interface NAND flash memory chip of claim 1 wherein the NAND flash memory chip includes configuration information storage and the interface configuration circuit selects the mode of operation for the interface based on configuration information stored in the configuration information storage in the NAND flash memory chip.

11. A method of one-time configuring a NAND flash memory chip comprising:
   receiving, by the NAND flash memory chip, in a one-time configuring procedure, a signal from a NAND flash memory controller located on a NAND flash memory controller chip that is separate from the NAND flash memory chip, the signal reflecting permanent hard-wired connections between the NAND flash memory chip and the NAND flash memory controller chip;
   determining, by the NAND flash memory chip, from the signal, whether the NAND flash memory controller is initiating parallel communication using a plurality of physical data Input/Outputs (I/Os) in parallel or serial communication using a physical data I/O of the plurality of physical data I/Os for serial communication while other physical data I/Os of the plurality of physical data I/Os are idle and are physically unconnected;
   in response to determining that the NAND flash memory controller chip is initiating serial communication, the NAND flash memory chip entering a serial communication mode in which stored data is transferred serially through the physical data I/O;

subsequently, the NAND flash memory controller chip remaining permanently in the serial communication mode, wherein the other physical data I/Os of the plurality of physical data I/Os are idle and physically unconnected;

in response to determining that the controller is initiating parallel communication, the NAND flash memory chip entering a parallel communication mode in which stored data is transferred in parallel; and subsequently, the NAND flash memory controller chip remaining permanently in the parallel communication mode.

12. The method of claim 11 wherein the NAND flash memory chip uses a first number of I/Os in the parallel communication mode and uses a second number of I/Os in the serial communication mode, the second number being smaller than the first number.

13. The method of claim 12 wherein the first number of I/Os contains both data I/Os and control I/Os, and the second number of I/Os contains fewer data I/Os and fewer control I/Os than the first number.

14. The method of claim 13 wherein the first number of I/Os contains eight data I/Os, the second number of I/Os contains only one data I/O.

15. The method of claim 11 wherein, in the serial communication mode, data is transferred serially at at least Double Data Rate (DDR) so that at least two bits of data are transferred per clock cycle.

16. The method of claim 15 wherein the data is transferred serially using a clock frequency of at least 200 Megahertz to provide a data transfer rate of at least 50 Megabytes per second.

17. The method of claim 11 wherein the determining is performed in a one-time procedure that reflects hard-wired connections to the NAND flash memory chip and wherein in serial mode at least seven bonding pads on the NAND flash memory chip are not used and are not bonded.

* * * * *